United States Patent [19]
Campbell

[11] 4,029,901
[45] June 14, 1977

[54] CONTROL CENTER FOR A COMMUNICATIONS SYSTEM WITH INTERCHANNEL PATCHING CAPABILITIES

[75] Inventor: Whitney Robertson Campbell, Elk Grove Village, Ill.

[73] Assignee: Motorola, Inc., Schaumburg, Ill.

[22] Filed: Nov. 13, 1975

[21] Appl. No.: 631,784

[52] U.S. Cl. .................................. 179/2 E; 325/53; 325/183

[51] Int. Cl.$^2$ ......................................... H04Q 7/04

[58] Field of Search ......... 179/41 A, 1 CN, 15 AT, 179/1 B, 2 A, 2 E; 317/99, 101 CB; 325/102, 308, 309, 183, 53

[56] References Cited

UNITED STATES PATENTS

| | | | |
|---|---|---|---|
| 1,754,878 | 4/1930 | Clement | 325/309 |
| 2,779,868 | 1/1957 | Rust | 325/183 |
| 3,308,239 | 3/1967 | Waldman et al. | 179/2 A |
| 3,551,605 | 12/1970 | Icenbice | 179/27 F |
| 3,577,080 | 5/1971 | Cannalte | 325/183 |
| 3,710,194 | 1/1973 | Zammut et al. | 317/101 R |
| 3,796,829 | 3/1974 | Gray | 325/308 |
| 3,889,365 | 6/1975 | Brock | 317/101 R |
| 3,912,875 | 10/1975 | Katz | 179/41 A |
| 3,922,508 | 11/1975 | Brady | 179/2 A |
| 3,932,716 | 1/1976 | Mottel et al. | 317/99 |

*Primary Examiner*—Kathleen H. Claffy
*Assistant Examiner*—E. S. Kemeny

*Attorney, Agent, or Firm*—Eugene A. Parsons; Victor Myer; James W. Gillman

[57] ABSTRACT

A radio communication system of base stations, and a telephone system, are linked and controlled by a control center. A housing having a plurality of control modules electrically and mechanically engaged therein, each control module having a front panel with a patch switch and a plurality of indicators thereon, the control modules each adapted to be connected to a transmitter/receiver base station for receiving all communications to and from the base station on an associated communications channel and controlling the operation of the base station, a plurality of buses mounted in the housing and a patch board on each of said modules for electrically connecting any of said modules to said buses upon operation of the patch switch on said module, a phone patch module mounted in the housing and adapted to be coupled to a pair of telephone lines and including a switch for patching any communications channel to the telephone lines upon operation of the switches in the control module for the communications channel and in the phone patch, an operator module mounted in the housing and including a monitor speaker, microphone, and push-to-talk switch and associated circuitry connecting the aforesaid to audio and push-to-talk buses in the housing, and a patch tone encoder module mounted in the housing and supplying a plurality of tones on a tone encoder bus, said tones being utilized by predetermined ones of said control modules to control the base station.

7 Claims, 8 Drawing Figures

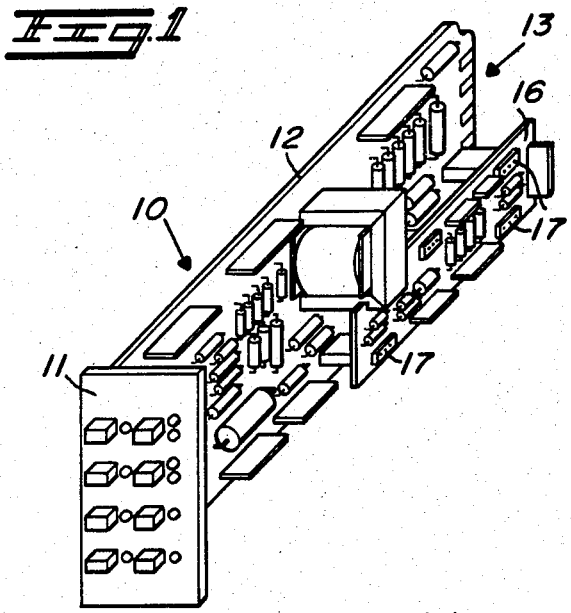
Fig. 1
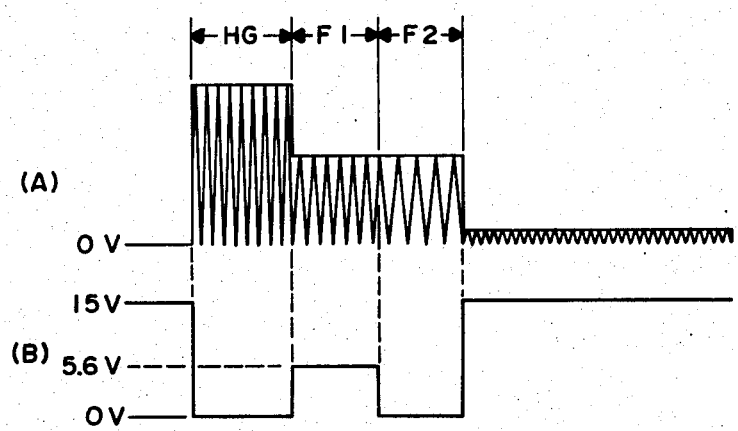
Fig. 8
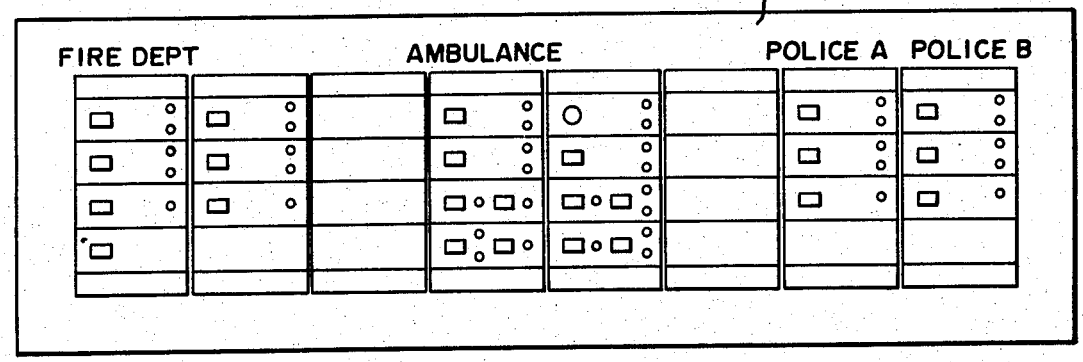
Fig. 2
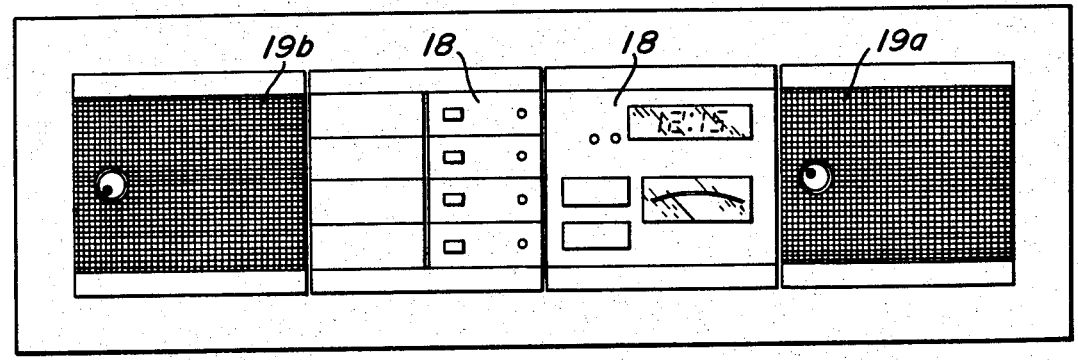

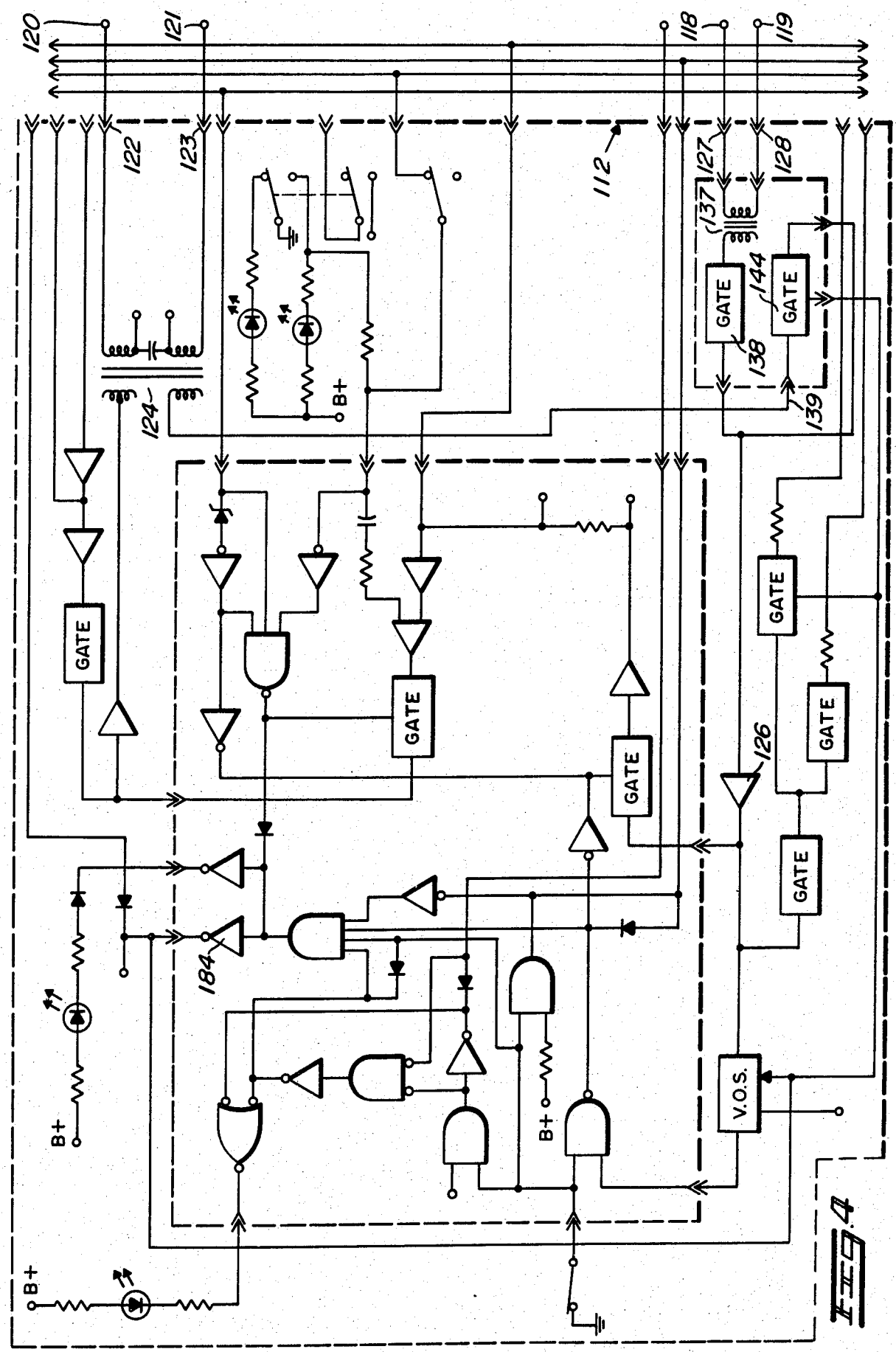

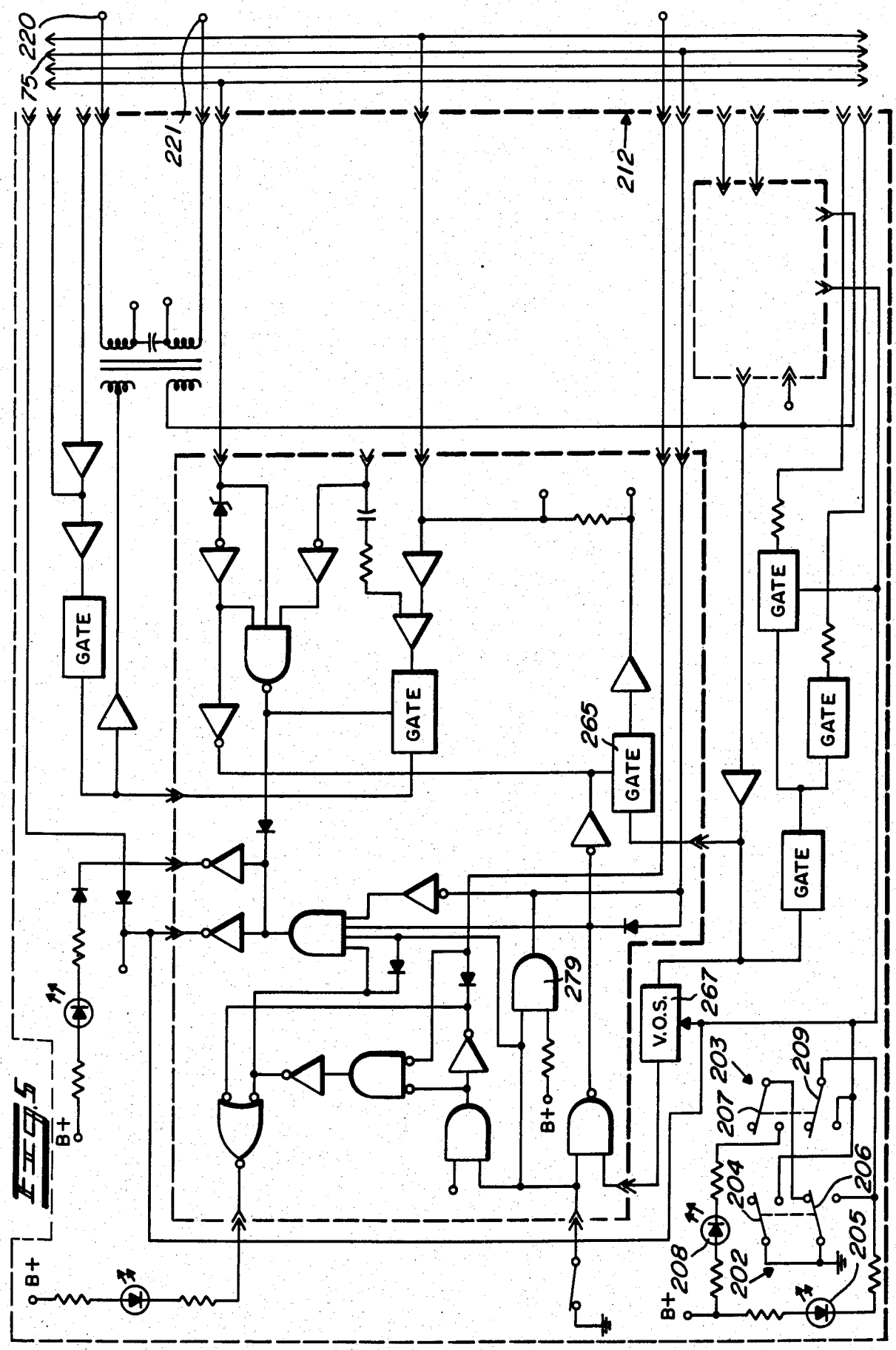

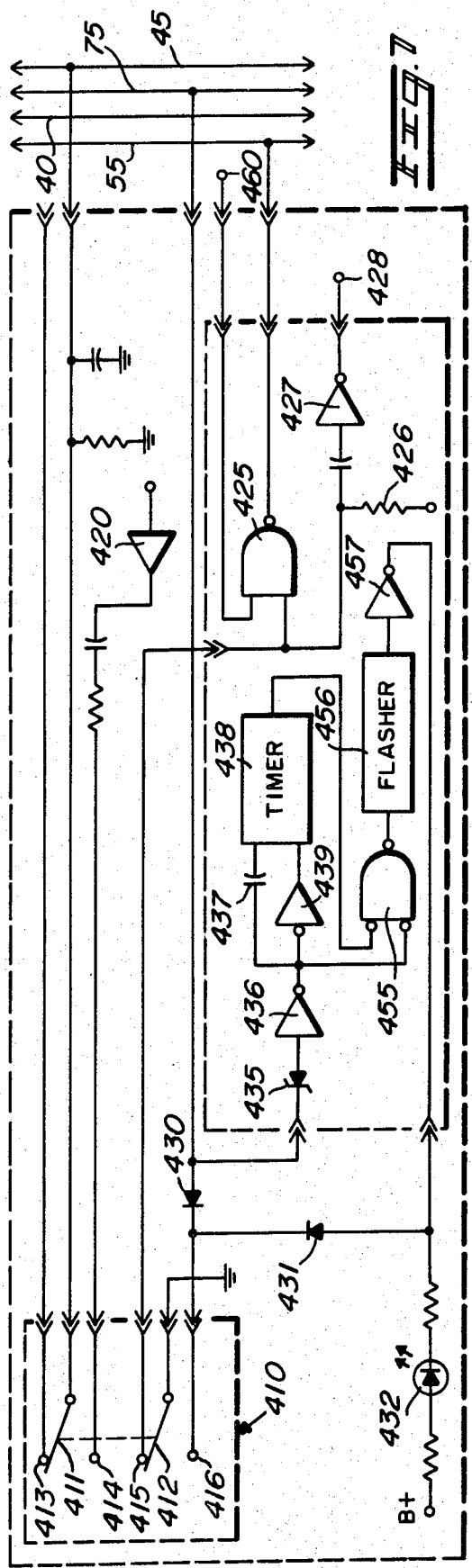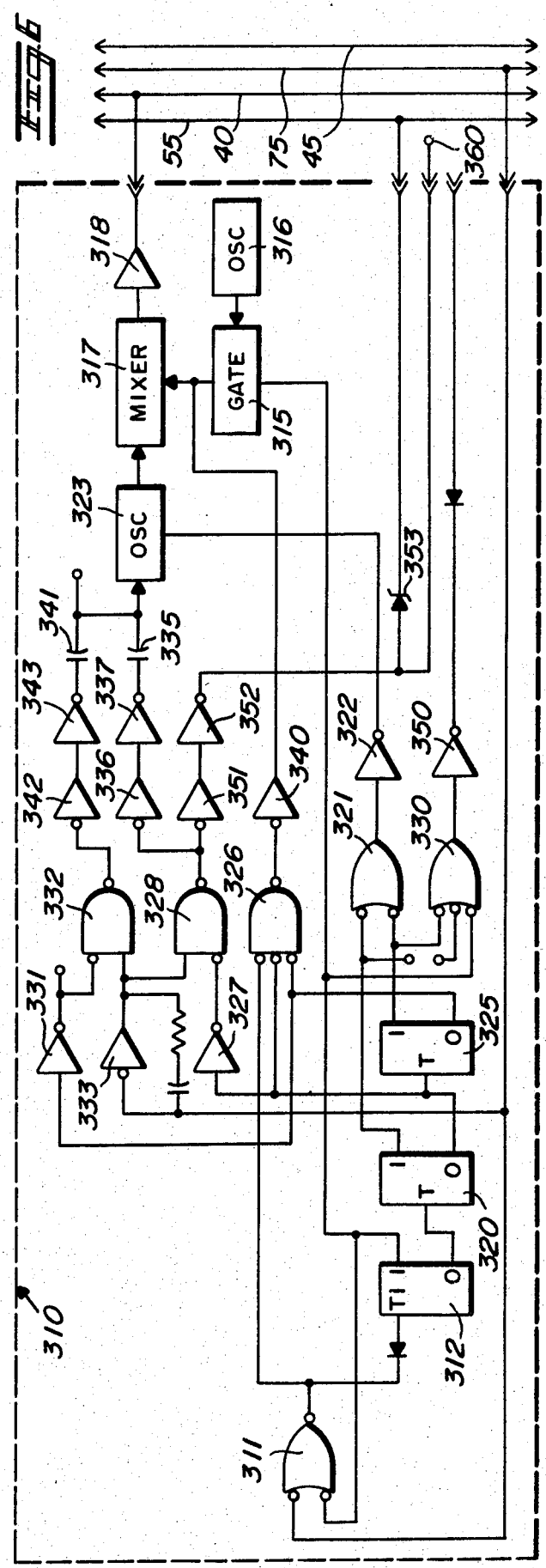

CONTROL CENTER FOR A COMMUNICATIONS SYSTEM WITH INTERCHANNEL PATCHING CAPABILITIES

BACKGROUND OF THE INVENTION

The present invention pertains to a control center for a communications system wherein a plurality of radio channels, each of which includes a base station and a plurality of mobile transceivers, are monitored and controlled by a single operator. A control center of this type is described, for example, in U.S. Pat. No. 3,577,080, entitled "Remote Control System for Operation Over Same Audio Channel Providing Voice Signals Between Remote Station and Base Station" and assigned to the same assignee. In many instances it is desirable for mobiles on one channel to converse with mobiles on another channel or to have access to telephone lines. It is essential that the operator be equipped to monitor each and every channel and that cross patching between channels or phone patching between a channel and telephone lines be quickly and easily performed by the operator. Further, the various components of the control center should be constructed so that additional channels can be easily added and patching capabilities can be included or excluded in each channel as desired.

At present, there are a variety of base stations, including DC controlled, tone controlled, two-wire simplex operation, four-wire full duplex operation, etc., and it may be necessary to control any or all of these base stations from a single control center. Further, tone controlled base stations generally require a first recognition or unmuting frequency followed by one of two operating frequencies, both of which must be available in the control center. In addition to these relatively major problems, many minor considerations, such as installation convenience, operator convenience and ease of control are included in the control center disclosed herein.

SUMMARY OF THE INVENTION

The present invention pertains to a control center for a communications system with interchannel patching capabilities including a housing having a plurality of control modules, an operator module and an optional phone patch module electrically and mechanically engaged therein, a plurality of electrically conductive buses mounted in said housing and electrically coupled to said modules, a switch mounted on the front of each of said control modules and said phone patch module, and a plurality of patch boards one each mounted on each of said plurality of control modules and, upon operation of the switch on the front of the control module, coupling predetermined ones of the buses to the communications channel controlled by the control module.

It is an object of the present invention to provide a control center for a communications system with new and improved interchannel patching capabilities.

It is a further object of the present invention to provide a new and improved control center having a variety of plug-in modules to accommodate different types of base stations and to provide convenient and versatile patching between channels and between channels and telephone lines.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a perspective view of a channel control module having a patch board affixed thereto;

FIG. 2 is a view in front plan of a control center;

FIG. 4 is a functional logic and partial schematic diagram similar to FIG. 3 of a second type of control module;

FIG. 5 is a functional logic and partial schematic diagram similar to FIG. 1 of a phone patch module embodying the present invention;

FIG. 6 is a functional logic and partial schematic diagram of a patch tone encoder module embodying the present invention;

FIG. 7 is a functional logic and partial schematic diagram of an operator module embodying the present invention; and FIG. 8 illustrates waveforms which are available for controlling remote transmitters in the patch mode of operation.

DESCRIPTION OF THE PREFERRED EMBODIMENT

Figure 3:
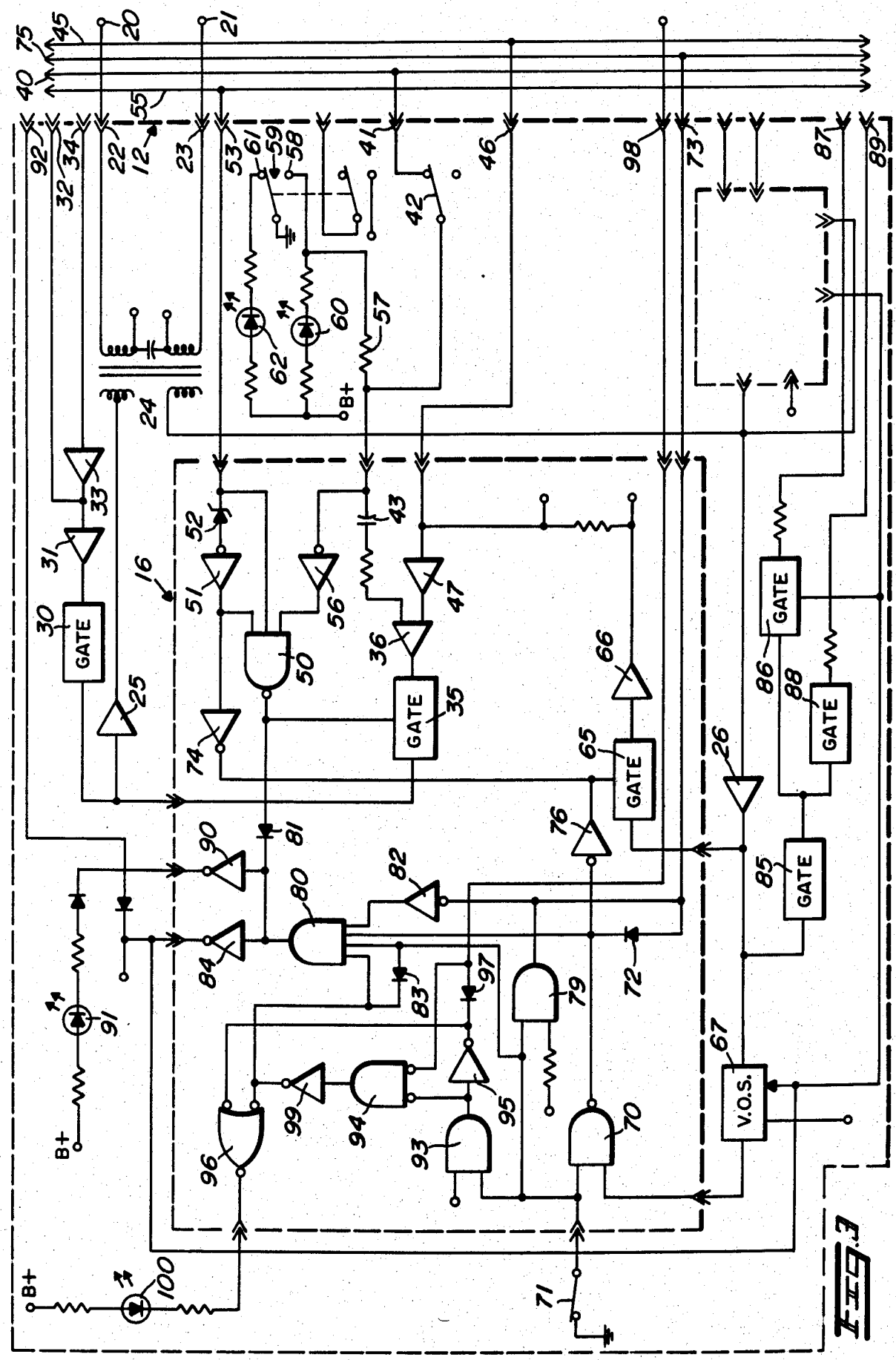
FIG. 3 is a functional logic and partial schematic diagram of a first type of control module embodying the present invention.

Referring specifically to FIG. 1, the numeral 10 generally designates a control module having a front or control panel 11 affixed to a printed circuit board 12 containing the various components. The rear edge of the board 12 has an edge connector or terminals, generally designated 13, thereon. The edge connector or terminals 13 aid in electrically and mechanically mounting the control module in a housing 15, illustrated in FIG. 2. A patch board 16, assembled on a second printed circuit board, is electrically and mechanically affixed to the printed circuit board 12 of the control module 10 by connector plugs 17. The control panel 11 of the control module contains a plurality of switches and indicator lights which will be described in more detail with reference to the schematic drawings, FIGS. 3-7. As can be seen in FIG. 2, the control panels of the various control modules may include different switches and indicator lights, depending upon the functions performed by the control panel and the type of base station associated therewith in the communications channel controlled thereby. A single control center may include a plurality of similar control modules or it may contain a variety of control modules, including DC and/or tone operated control modules with two-wire and/or four-wire connections to the base station, one or more phone patch modules, a patch tone encoder module, an operator control module 18, select speaker 19a and unselect speaker 19b. For convenience in understanding the control center a schematic diagram of each of the various modules is included herewith and described hereinafter.

Referring specifically to FIG. 3, a control module for operating a base station over a single pair of phone lines is illustrated schematically. Therefore, transmit audio, receive audio and control tones are sent over the same pair of phone lines, which phone lines are designated by terminals 20 and 21. It should be noted that the patch board 16 is separated from the control module printed circuit board 12 by connectors (illustrated but not numbered) and a dotted line, and all of the circuitry on the control module printed circuit board 12 operates in a normal fashion when the patch board 16 is removed. The line terminals 20 and 21 are connected to a pair of input/output terminals 22 and 23, respectively, on the edge connector 13, which terminals 22 and 23 are in turn connected across a winding in a matching transformer 24. A second winding of the transformer 24 is connected to receive audio from a line driver 25 and a third winding is connected to supply audio to a compression amplifier 26. The line driver amplifier 25 may be, for example, similar to the amplifier described in the co-pending U.S. application filed June 30, 1975, Ser. No. 591,587, entitled "Audio Line Driver Amplifier", and assigned to the same assignee. The compressor amplifier may be, for example, similar to the compressor amplifier described in the copending application filed June 30, 1975, Ser. No. 591,388, entitled "Audio Compressor/Limiter Amplifier", and assigned to the same assignee. It should be understood that throughout the description of the control module of FIG. 3, as well as the various modules illustrated in FIGS. 4-7, standard transmitter/receiver circuitry is not illustrated unless it affects the patching system and, therefore, many gates and other circuits are illustrated without showing the actual circuitry which causes the operation thereof. Throughout this description references to control center wiring and other control center connections will be made but, since these connections are generally well known to those skilled in the art of control center communications systems, such connections will not, in many instances, be shown.

An input of the line driver amplifier 25 is connected to a transmit gate 30 and an audio amplifier 31, the input of which is in turn connected to a terminal 32 on the edge connector 13 and, through a second amplifier 33, to a terminal 34 on the edge connector 13. In standard operation of the control center from a radio control module, the operator supplies tones for controlling the remote transmitter on the terminal 32 and voice communications on the terminal 34. The input of the line driver 25 is also connected through a second transmit gate 35 to the output of an audio amplifier 36. Patch tones are supplied from a bus 40 to one input of the audio amplifier 36 through a terminal 41 of the edge connector 13, a switch 42, and a DC blocking capacitor 43. Patch audio is supplied to an input of the audio amplifier 36 from a second patch bus 45 through a terminal 46 of the edge connector 13 and a second audio amplifier 47. The transmit gate 30 operates, through a connection not shown, to supply audio to the line driver 25 when the transmitter is operating in an unpatched mode. The control terminal of the transmit gate 35 is connected to the output of an AND gate 50 having three inputs. The AND gate 50 is constructed so as to provide a low signal at the output thereof to operate the gate 35 and remove patch audio from the line driver 25 when the three inputs all have high signals on them. The first input of the AND gate 50 is connected through an inverter 51, zener diode 52 and a terminal 53 in the edge connector 13 to a third bus line 55. The second input of the AND gate 50 is connected directly to the terminal 53. The third input of the AND gate 50 is connected through an inverter 56 and the switch 42 to the terminal 41, which is connected to the bus 40. The inverters 51 and 56 are constructed so that a low signal applied to the input thereof is inverted and appears as a high signal at the output while high signals applied to the inputs thereof are inverted but have no affect on the remaining circuitry.

FIG. 8, waveform A illustrates the three tone sequence (guard tone, F1 and F2) available on the patch bus 40 for controlling a remote tone controlled transmitter in the patch mode of operation. Remote transmitters are operated by applying thereto the guard tone and either the F1 or F2 tone, depending upon the switch settings of the remote transmitter. If the remote transmitter is set to operate when it receives a guard tone and an F2 tone, the F1 tone must be muted so that it is not received by the transmitter. FIG. 8, waveform B illustrates the logic waveform available on the patch bus 55 for muting the F1 tone so that a transmitter set in the F2 mode of operation can be controlled during patching. The waveforms of FIG. 8 are generated by a patch tone encoding module to be described with reference to FIG. 6.

The input of the inverter 56 is also connected through a resistor 57 to one stationary contact 58 of a single-pole double-throw switch generally designated 59. The contact 58 is also connected through a light emitter diode and resistor network 60 to a terminal designated with a plus which is adapted to have a source of positive voltage applied thereto (not shown). The movable contact of the switch 59 is connected directly to ground and a second stationary contact 61 is connected through a light emitting diode and resistor network 62 to the positive terminal. When the movable contact of the switch 59 is engaged with the stationary contact 58 the light emitting diode 60 is energized to indicate that the transmitter is in the F2 mode of operation and a logical low is applied to the input of the inverter 56 so that a high is prevalent at the output thereof. In this embodiment, the logical signal prevalent on the bus 55 during the F1 tone (see FIG. 8, waveform B) is only approximately 5.6 volts and the zener diode 52 is a 12 volt diode, so that the inverter 51 sees a logical zero and supplies a high signal to the AND gate 50, but the second input of the AND gate 50 receives the 5.6 volt logical signal directly so that all of the inputs to the AND gate 50 appear high and a low is produced at the output to operate the gate 35 and prevent the F1 tone from passing therethrough. During the guard tone and the F2 tone the signal applied to the second input of the AND gate 50 is low so that the signal from the AND gate 50 is high and the transmitter gate 35 passes both tones.

When the movable contact of the switch 59 is engaged with the stationary contact 61 the light emitting diode 62 is energized to indicate that the transmitter is in the F1 mode and the stationary contact 58 is ungrounded so that a logical high is applied to the inverter 56. This produces a low at the input of the AND gate 50 which produces a high at the output of the AND gate 50 so that the transmitter gate 35 remains closed to pass both the guard tone and the F1 tone to the line driver 25. Because the remote transmitter is operated by the F1 tone, the subsequent F2 tone has no affect and it is not necessary to mute it.

The output of the compressor amplifier 26 is applied through a receive gate 65 to an amplifier 66, the output of which is applied through the terminal 46 to the patch bus 45. The audio output from the compressor amplifier 26 is also applied to a voice operated switch 67 which is simply a circuit sensitive to audio that provides a positive output when audio is supplied thereto. Voice sensitive circuits are well known in the art and may include, for example, simply a low pass filter or integrating circuit. An output of the voice operated switch 67 is connected to one input of a two input AND gate 70, the other input of which is connected through a patch enable switch 71 to ground. The switch 71 is opened, ungrounding the second input of the AND gate 70, to enable the patch board 16. When the voice operated switch 67 is activated and the switch 71 is open both of the inputs of the AND gate 70 are high and a low is produced at the output, which logical low is supplied through a diode 72 and a terminal 73 of the edge connector 13 to a fourth patch bus 75. The logical low supplied to the patch bus 75 operates as a push-to-talk (PTT) signal at the control module to which the audio on the patch bus 45 is supplied. The logical low at the output of the AND gate 70 is also applied through an inverter 76 to the control terminal of the receive gate 65 to operate the gate and allow audio from the compressor amplifier 26 to pass therethrough to the amplifier 66. The output of the AND gate 70 is also connected to one input of a four input AND gate 80, the output of which is connected through a diode 81 to the control terminal of the transmit gate 35. When the output of the AND gate 70 is negative (audio is being supplied to the switch 67) the AND gate 80 produces a negative output signal which operates the transmit gate 35 to prevent audio from passing therethrough. Thus, with audio being received on the phone lines 20 and 21 from the base station associated with the control module 12 this audio passes through the control module 12 to the patch bus 45 and a negative push-to-talk signal is developed and supplied to the patch bus 75. An inverter 74 is connected from the output of the inverter 51 to the control electrode of the receive gate 65 and provides a logical low to prevent audio from passing through the gate 65 whenever the waveform shown in FIG. 8(b) is present on the patch bus 55.

When the control module 12 receives audio on the patch bus 45 and a negative push-to-talk signal on the patch bus 75 from another control module in the control center, the transmit gate 35 must be opened to allow the audio to pass therethrough to the line driver 26. The patch bus 75 is connected through the terminal 73 and the diode 72 to one input of the AND gate 80. The terminal 73 is also connected through an inverter 82 to a second input of the AND gate 80. A third input of the AND gate 80 is connected to the switch 71, which is grounded in the closed position. The switch 71 is also connected to a fourth input of the AND gate 80 through a diode 83. When a negative push-to-talk signal is prevalent on the patch bus 75, the inverter 82 supplies a positive signal to one input of the AND gate 80 and the diode 72 blocks the negative push-to-talk signal so that the second input of the AND gate 80 is high. If the switch 71 is open to enable the patch, the third and fourth inputs of the AND gate 80 are high so that a high is produced at the output and the transmit gate 35 remains in a state to supply audio to the line driver 25. The logical high signal at the output of the AND gate 80 is applied through an inverter 84, which switches it to a logical low, to a control input of the voice operated switch 67 to prevent the switch 67 from being switched on by audio from the compressor amplifier 26. Thus, the audio on the patch bus 45 and the push-to-talk signal on the patch bus 75 control the module 12, until the audio ceases. Audio from the compressor amplifier 26 is supplied through a mute gate 85 to a select gate 86 and output terminal 87 of the edge connector 13 for application to the operator select speaker 19a in the control center. The audio from the mute gate 85 is also supplied through an unselect gate 88 to an output terminal 89 of the edge connector 13 for application to the operator unselect speaker 19b in the control center. The select and unselect speakers in the control center are utilized by the operator to monitor the various channels assigned to the operator. The negative signal at the output of the inverter 84 is also supplied to the select gate 86 and the unselect gate 88 to prevent audio from passing therethrough when audio is being received by the control module 12 from the patch bus 45. The positive signal at the output of the AND gate 80 is also applied to an inverter 90 having an output connected through a light emitting diode and associated resistors 91 to a plus terminal having a source of positive voltage applied thereto. Thus, when a low logic signal appears at the output of the inverter 90 the light emitting diode 91 is energized indicating that the control module is transmitting audio to the base station on the phone lines 20 and 21. The negative signal at the output of the inverter 84 is also supplied to a terminal 92 of the edge connector 13 which is connected to supply a busy signal to the operator of a parallel control center.

The patch enable switch 71 is also connected to one input of an AND gate 93, a second input of which is connected to a terminal which remains high. The output of the AND gate 93 is connected directly to a first input of an AND gate 94, through an inverter 95 to a first input of an OR gate 96, and through the inverter 95 and a diode 97 to an output terminal 98 of the edge connector 13. The output terminal 98 is also connected directly to a second input of the AND gate 94, the output of which is connected through an inverter 99 to a second input of the OR gate 96. The output of the inverter 99 is also connected to the fourth input of the AND gate 80 and, through the diode 83 to the third input of the AND gate 80. The output of the OR gate 96 is connected through a light emitting diode and resistor combination 100 to a plus terminal having a positive source of voltage (not shown) attached thereto.

When the switch 71 is closed (the input of the AND gate 93 is grounded as shown) and a high signal is prevalent at the terminal 98, the output of the OR gate 96 is high and the LEd 100 is not energized. If the switch 71 is opened to enable the patch board 16, a high is applied to the input of the AND gate 93 which produces a high at the output thereof. The high at the output of the AND gate 93 is inverted to produce a low by the inverter 95, which low is applied to the OR gate 96. The OR gate 96 is constructed so that a low on either of the inputs produces a low at the output which energizes the LED 100. The diode 97 is connected in the circuit so that the low at the output of the inverter 95 appears at the terminal 98 and is coupled to any other control modules connected in parallel with the module 12. Because present law requires an operator to monitor all of the channels and because a single operator cannot monitor large numbers of channels, in some systems having large numbers of channels it is necessary to supply two or more control centers, each having a control module for each of the channels and the operator at each control center being assigned certain channels to monitor. When it is necessary to patch a channel being monitored by one operator to a channel being monitored by another operator, some means of indicating the patch to both operators must be included in the control centers. The terminals 98 and the logic circuitry attached thereto provide this function.

With the patch enable switch 71 in the closed position, when a low logic signal (indicating a busy parallel control module) is applied to the terminal 98, both inputs to the AND gate 94 are low providing a high at the output thereof. The high logic signal at the output of the AND gate 94 is inverted to a low logic signal by the inverter 99, which low signal operates the OR gate 96 to energize the LED 100, indicating that the control module has been patched. The low signal at the output of the inverter 99 is also applied to two inputs of the AND gate 80 to cause a low at the output thereof, which prevents audio from being applied to the line driver 25 through the transmit gate 35. Thus, operating the enable switch 71 energizes the LED 100 and supplies a low logic busy signal at the terminal 98 for any parallel connected control modules. Also, if a parallel connected control module is patched a low logic busy signal is supplied to the control module 12 to energize the LED 100 and prevent the control module 12 from applying audio to the phone lines 20 and 21 on the patch audio bus 45.

A two input AND gate 79 has a positive reference voltage applied to one input and the other input connected to the enable switch 71. The output of the AND gate 79 is connected to the patch bus 75 and supplies a high signal thereto when the enable switch 71 is opened. The combination of this high signal from the AND gate 79 and no push-to-talk signal on the bus 75 raises the voltage on the bus 75 high enough to cause (after a predetermined time) a light in the control center to flash, as will be described in conjunction with FIG. 7. If a push-to-talk signal is present, the voltage on the bus 75 drops to a logical low and the light in the control center remains energized in a steady state. Thus, the light and the AND gate 79 in each control module operate as an activity detector for the operator.

Referring specifically to FIG. 4, a control module 112 is illustrated, which control module is basically the same as the control module 12 illustrated in FIG. 3. The control module 112 is connected for four-wire operation instead of two-wire operation so that simplex or full duplex (with some modifications) operation is possible. Two transmit wires 120 and 121 are connected to a pair of input terminals 122 and 123 are described in the circuit of FIG. 3. A second pair of wires 118 and 119 are connected to a pair of input terminals 127 and 128 and supply audio thereto from the associated base station. All of the circuitry in FIG. 4 operates the same as described in conjunction with FIG. 3 except that audio is not supplied from the matching transformer 124 to the compression amplifier 126. The audio from the associated base station appears at the terminals 127 and 128 and is connected through a matching transformer 137 and amplifier 138 to the compression amplifier 126. A jumper 139 is moved from the two-wire position (which connects the transformer 124 to the compression amplifier 126) to the four-wire position (which connects the transformers 124 through a gate 144 to the input of the compression amplifier 126). The gate 144 is controlled by the output of the inverter 184 to allow audio to be coupled from the matching transformer 124 through the gate 144 to the compression amplifier 126 when a remote operator is supplying audio to the matching transformer 124 and, consequently, the pair of lines 120 and 121. Since all of the operators operating the various control centers and monitoring the different channels connected thereto may not be close enough to hear each other's voice, it is necessary to provide a path whereby the voice of each operator can be heard by each of the other operators. The gate 144 supplies this path.

Referring specifically to FIG. 5, a control module 212 is illustrated, which module is basically the same as the control module 12 illustrated in FIG. 3 except that terminals 220 and 221 are connected to a telephone terminal by a pair of telephone lines, as opposed to a base station. Since a two-wire connection is illustrated, the four-wire board (transformer 137 and gates 138 and 144 in FIG. 4) is not included, but can be added if four-wire operation is desired. Thus, by utilizing the control module 212 and one of the control modules illustrated in FIGS. 3 or 4 a base station can be connected into a telephone system through the telephone terminal connected to the control module 212. The control module 212 is connected for two-wire operation, similar to the control module 12 illustrated in FIG. 3, and all of the remaining components operate in a fashion similar to that described in conjunction with FIG. 3 except that the tone keying circuitry switches 42 and 59 and associated components are deleted because they are not needed. In addition, a pair of double-pole double-throw switches 202 and 203 are provided for use with poor quality phone lines. The switch 202 has a first movable contact 204 and a second movable contact 206, both of which are connected directly to ground. A stationary contact associated with the movable contact 204 is connected directly to the control input of the voice operated switch 267. The switch 203 has a movable contact 207, connected directly to a stationary contact associated with the movable contact 206 of the switch 202, and a movable contact 209 connected to a second stationary contact associated with the movable contact 206 and through a light emitting diode and resistor network 205 to a positive terminal having a source of voltage (not shown) connected thereto. A stationary contact associated with the movable contact 207 is connected through a light emitting diode and resistor network 208 to the positive terminal. A stationary contact associated with the movable contact 209 is connected directly to the control terminal of the voice operated switch 267. When a phone line is extremely noisy and the noise level is such that the voice operated switch 267 remains energized after audio signals are removed therefrom, the operator operates the switch 202 so that the movable contact 204 is engaged with the stationary contact associated therewith to ground the control terminal of the voice operated switch 267 and de-energized that circuit. Simultaneously the second movable contact 206 of the switch 202 engages one of the associated stationary contacts to energize the light emitting diode 205 and indicate that the switch 202 is operated. One the voice operated switch 267 is de-energized the push-to-talk signal is removed from the bus 75 and the channel is de-energized so that the switch 202, which is a momentary type of switch biased into the position illustrated, may be released.

If the phone lines 221 and 220 are of such poor quality that the audio applied to the voice operated switch 267 does not have sufficient amplitude for the energization thereof, the operator activates the switch 203 which supplies a constant DC signal through the movable contact 209 to the control terminal of the voice operated switch 267 and, simultaneously, causes the light emitting diode 208 to be energized. The switch 203 is also a momentary type of switch which is biased into the position illustrated so that, upon completion of the audio message, the operator simply releases the switch and the entire circuit then returns to its normal operating condition. The switches 202 and 203 are of course optional circuitry and are not required for the operation of the phone patch module 212.

Referring specifically to FIG. 6, a patch tone encoder module 310 is illustrated, which module supplies the signals illustrated in FIG. 8. Whenever a push-to-talk signal appears on the patch bus 75, the patch tone encoder module 310 is energized as follows. When a push-to-talk signal is applied to the patch bus 75 by any of the control modules 12, 112, 212 or by the control center operator the potential of the patch bus 75 goes to a logical low. The logical low push-to-talk signal on the bus 75 is connected to one input of an OR gate 311, which causes the OR gate 311 to supply a logical low signal at the output thereof. The output of the OR gate 311 is connected to the input of a 120 millisecond timer 312. The timer 312 is, for example, a simple flip-flop type timer having an input and a pair of outputs with opposite logical levels thereon. A first output of the timer 312, which has a low logic signal thereon when the timer 312 is activated, is connected to a second input of the OR gate 311 to supply a locking action to retain the OR gate 311 energized throughout the 120 milliseconds and is connected to the input of a 30 db attenuation gate 315. The gate 315 connects a guard tone oscillator 316 to a mixer 317 with no attenuation when a low signal is being supplied thereto from the timer 312. Once the 120 millisecond time has passed and the output of the timer 312 rises to a high logical signal, the gate 315 switches 30 db of attenuation into the circuit to reduce the output of the guard tone oscillator 316 by 30 db. The output of the mixer 317 is supplied to the patch bus 40 through an amplifier 318. Thus, during the 120 milliseconds that the timer 312 is operating after a push-to-talk signal is supplied to the OR gate 311, a high level guard tone is applied from the oscillator 316 to the patch bus 40. Upon the completion of the 120 millisecond time period, the low signal is removed from the input of the gate 315 and 30 db of attenuation is switched into the circuit so that only a low guard tone is available at the output thereof.

At the completion of the 120 millisecond time period the timer 312 supplies an activating signal to the input of a 40 millisecond timer 320. One output of the timer 320 is connected to one input of an OR gate 321, the output of which is connected through an inverter 322 to a function tone oscillator 323. A second output of the timer 320 is connected to the input of a second 40 millisecond timer 325, to one input of a 3 input AND gate 326 and through an inverter 327 to one input of a 2 input AND gate 328. A first output of the timer 325 is connected to a second input of the OR gate 321 and to a first input of a second OR gate 330. A second output of the timer 325 is connected to a second input of the AND gate 326 and through an inverter 331 to a first input of a 2 input AND gate 332. The other two inputs of the AND gates 328 and 332 are connected to the output of an inverter 333, connected as a transmit tone switch, the input of which is connected directly to receive the push-to-talk signal from the patch bus 75.

During the time that a push-to-talk signal appears on the patch bus 75 the inverter 333 supplies a high signal to the second inputs of the AND gates 328 and 332 to place them in condition to be activated by a proper signal applied to the first inputs thereof. During the 40 milliseconds that the timer 320 is operating, the first input thereof supplies a low signal to the OR gate 321 which activates the OR gate causing it to turn on the function tone oscillator 323 through the inverter 322. Simultaneously the second output of the timer 320 is supplying a high signal through the inverter 327 to activate the AND gate 328 connecting a capacitor 335 to the function tone oscillator 323 through a pair of inverters 336 and 337. The capacitor 335 tunes the function tone oscillator 323 to the F1 tone, which is therefore applied to the patch bus 40 for the 40 milliseconds that the timer 320 is operating. Also, during this time the second output of the timer 320 is supplying a high level signal to an input of the AND gate 326, causing a high level output signal to be supplied to an inverter 340. The output of the inverter 340, which is connected to the output of the 30 db attenuation gate 315, appears low until a low level signal is applied to the input thereof. Thus, with the high level signal applied to the input thereof the low level at the output of the inverter 340 effectively grounds the output of the 30 db attenuation gate 315 so that no guard tone is applied to the mixer 317.

At the completion of the first 40 milliseconds the outputs of the timer 320 switch so that a high level signal is applied to the OR gate 321, deactivating the OR gate, and a low level signal is applied to the inverter 327, deactivating the AND gate 328. However, the low level signal at the second output of the timer 320 is also applied to the input of the timer 325, which thereby activates the timer 325. Upon activation of the timer 325 the first output goes to a low logical signal which activates both of the OR gates 321 and 330 and the function tone oscillator 323 is again activated. The second output of the timer 325 goes to a high level signal which, through the inverter 331 activates the AND gate 332. The output of the AND gate 332 connects a capacitor 341 to the function tone oscillator 323 through a pair of inverters 342 and 343. The capacitor 341 tunes the function tone oscillator 323 to the F2 frequency. Also, the positive output signal from the timer 325 maintains the AND gate 326 and inverter 340 deactivated to effectively ground the output of the 30 db attenuation gate 315 so that no guard tone appears at the mixer 317. When the timer 325 switches to an inactive state the OR gate 321 becomes inactive so that the function tone oscillator 323 is switched off. Simultaneously, the three signals applied to the inputs of the AND gate 326, from the OR gate 311 and the timers 320 and 325, are all low level signals so that the output of the AND gate 326 is a low level signal and the output of the inverter 340 is a high level signal. Thus, the low level guard tone from the 30 db attenuation gate 315 is no longer grounded and now appears on the patch bus 40. The low level guard tone is applied to the patch bus 40 until the push-to-talk signal on the patch bus 75 is removed. When the push-to-talk signal on the patch bus 75 is removed the output of the OR gate 311 goes to a high level signal which deactivates the AND gate 326 and inverter 340 to ground the output of the 30 db attenuation gate 315 and remove the low level guard tone from the patch bus 40.

The output of the timer 312 is connected to one input of the OR gate 330 and, during the time that the timer 312 is operating, the negative signal at the output thereof operates the OR gate 330 to provide a high logical signal at the output thereof. This high logical signal is applied through an inverter 350 to the patch bus 55. The inverter 350 provides a logical low at the patch bus 55 as long as a high signal is applied to the input thereof. Thus, the patch bus 55 is held at a logical low throughout the 120 milliseconds that the timer 312 is operating.

When the timer 312 times out and the timer 320 begins to operate, the low logical signal at the output of the AND gate 328 is applied to a first inverter 351 which converts the signal to a high logical signal and the output thereof is applied to an inverter 352 which converts the signal to a low logical signal. The low logical signal at the output of the inverter 352 is applied through a zener diode 353 to the patch bus 55. The zener diode 353 maintains the logical low at the output of the inverter 352 at an amplitude of approximately 5.6 volts. It should of course be understood that this voltage is not critical and the voltage waveform on the patch bus 55 (illustrated as waveform B in FIG. 8) may be held at any predetermined value during the F1 tone which will cause the described operation of the foregoing circuits. When the timer 320 times out and the timer 325 begins to operate, the low logical signal at the output thereof is applied to the OR gate 330 and causes a high logical signal to appear at the output thereof. This high logical signal is inverted in the inverter 350 and causes the patch bus 55 to have a low logical level thereon throughout the operation of the timer 325. When the timer 325 times out the OR gate 330 is inactivated and the output of the inverter 350 goes to a logical high so that the voltage on the patch bus 55 goes high. Thus, the voltage waveform on the patch bus 55 appears as waveform B in FIG. 8.

Referring specifically to FIG. 7, an operator control module is illustrated which provides the necessary control functions for the operator to communicate with the various channels on patch. A double-pole double-throw switch 410 has a first movable arm 411 and a second movable arm 412. The movable arm 411 has a pair of stationary contacts 413 and 414 associated therewith and the movable arm 412 has a pair of stationary contacts 415 and 416 associated therewith. The switch 410 is biased into the normal position illustrated and may be moved into the second position, temporarily, when the operator wishes to transmit. The movable contact 411 is connected directly to the audio patch bus 45 and the stationary contact 413, normally in contact with the movable contact 411, is connected directly to an amplifier and speaker (not shown). The stationary contact 414 is connected through a compressor amplifier 420 to a microphone (not shown). Thus, with the switch 410 in the position illustrated the speaker is connected directly to the audio patch bus 45 so that the operator may monitor audio on the patch bus 45 and with the switch 410 moved into the second position the microphone is connected to the patch bus 45 so that the operator may apply audio to the patch bus 45. It should of course be understood that the amplifier and speaker is illustrated as connected directly to the patch bus 45 through the switch 410, and is an optional feature used to monitor all channels on patch. Other circuitry is included, as previously described, so that the operator may listen to specific channels or may turn off the audio from all of the channels if desired.

The movable contact 412 of the second half of the switch 410 is connected directly to ground. The stationary contact 415, normally engaged with the movable contact 412, is connected to one input of an AND gate 425 and through an integrating circuit 426 to an inverter 427. The output of the inverter 427 is connected to a terminal 428 which supplies a mute signal to the mike system so that the operator's voice is not applied to amplifier 420 until after the tones have been sent. The stationary contact 416 is connected through a diode 430 to the patch bus 75 and supplies a logical low signal thereto when the movable contact 412 is engaged with the stationary contact 416. The stationary contact 416 is also connected through a diode 431 and light emitting diode and resistor network 432 to a plus terminal having a positive voltage source applied thereto. Thus, when the movable contact 412 is moved into engagement with the stationary contact 416 the light emitting diode 432 has a voltage applied thereacross and is energized.

The patch bus 75 is also connected through a zener diode 435 to an inverter 436. The output of the inverter 436 is connected through a capacitor 437 to a first input of a timer 438 and through an inverter 439 to a second input of the timer 438. The output of the timer 438 is connected to one input of an AND gate 455, the other input of which is connected directly to the output of the inverter 436. The output of the AND gate 455 is connected to the input of a light flasher 456, the output of which is connected through an inverter 457 to the light emitting diode 432.

A second input of the AND gate 425 is connected by way of a terminal 460 to a terminal 360 in the circuit of FIG. 6. The terminal 360 in FIG. 6 is connected directly to the output of the inverter 352 and has a logical low signal thereon however the F1 tone appears at the patch bus 40. Thus, whenever the terminal 460 has a logical low thereon the logical low is applied to an input of the AND gate 425, which essentially deactivates the AND gate 425. With no tones present on the patch bus 40 the terminal 360 is at a logical high and, with the movable contact 412 disengage from the stationary contact 415 the second terminal of the AND gate 425 is at a logical high so that a logical low is applied to the patch bus 55. This logical low signal on the patch bus 55 operates the receiver gates 65, 265 in the various control modules so that none of the control modules can apply audo to the patch bus 45. Once the operator gains control of the patch buses the logical low signal remains on the patch bus 55 until the operator releases the switch 410.

As previously described, in conjunction with FIG. 3, the AND gate 79 in the control module 12 (also AND gate 179 in control module 112 or AND gate 279 in control module 212) supplies a high logical signal to the bus 75 when the control module 12 is enabled. With a push-to-talk signal applied to the bus 75 the total voltage is relatively low, in this embodiment approximately one volt, so that the zener diode 435 blocks the application of the voltage to the inverter 436. Also, of none of the control modules are enabled (and consequently no push-to-talk signal is prevalent on the bus 75) the voltage on the bus 75 is approximately 9 volts, in this embodiment, and again the zener diode 435 blocks the voltage from being applied to the inverter 436. However, with one of the control modules enabled and the push-to-talk signal removed, as for example when the conversion is completed, the voltage on the patch bus 75 rises to approximately 24 volts, in this embodiment, and a high level logical signal is supplied to the inverter 436, which in turn supplies a low level signal to the timer 438 through the inverter 439 and to one input of the AND gate 455. The timer 438 times out and then supplies a negative signal to the other input of the AND gate 455 which causes the AND gate 455 to activate the flasher 456. The flasher 456 supplies a periodic high level signal to the inverter 457 which supplies a periodic low level signal to the light emitting diode 432 to cause the light emitting diode 432 to flash, indicating that a channel is enabled but there is no activity on the channel. The operator can then close the enable switch 71 of that control module, thereby removing the patch.

Thus, an improved control center for a communications system is described including a plurality of control modules capable of accommodating a variety of base stations. Further, each control module may have connected thereto a patch board so that two base stations and their associaed channels can be quickly patched for intercommuniction therebetween. In addition, one or more phone patch modules can be included in the control center so that one or more base stations can be quickly and easily interconnected with a set of phone lines associated with each of the phone patch modules. Each of the control modules has switches and indicators associated therewith so that the operator can quickly and easily patch modules, determine if the modules are patched and determine when the communication is completed so that the patch may be broken. A DC control module has not been illustrated in this disclosure because the operation is straight forward, but it should be understood that the disclosed system will operate as described and claimed with DC or tone control modules.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A control center for a radio communications system with interchannel patching capabilities comprising:
   a. a housing adapted to have a plurality of control modules electrically and mechanically engaged therein;
   b. a plurality of electrically conductive buses mounted in said housing;
   c. a plurality of dedicated control modules having a front panel and mounted in said housing, each of said modules being adapted to be electrically connected to a transmitter/receiver base station for controlling all communications to and from its respective base station on an associated communications channel and for controlling the operation of said base station, each of said modules further having a plurality of terminals thereon one each of which is electrically connected to each of said buses;
   d. a switch mounted on the front panel of each of said control modules; and
   e. a plurality of patch boards one each mounted on each of said plurality of control modules, each of said patch boards including associated circuitry electrically connected to the plurality of terminals, to various communications output terminals on the mounted control module and to said switch on the front panel, said switch being connected to provide electrical contact between predetermined ones of the various communications output terminals and predetermined ones of the plurality of terminals for providing selected patching between said normally dedicated communications channels.

2. A control center as claimed in claim 1 wherein the housing contains a plurality of plugs for receiving modules in electrical and mechanical engagement therein and each module includes a plug for receiving a patch board in electrical and mechanical engagement therein.

3. A control center as claimed in claim 1 including in addition a phone patch module mounted in the housing, said phone patch module including a switch and associated circuitry electrically connected to the buses in the housing and adapted to be coupled to a pair of telephone lines for coupling the telephone lines to predetermined ones of said buses upon operation of said switch.

4. A control center as claimed in claim 1 wherein the buses include an audio and a push-to-talk bus, the center further including an operator module mounted in said housing and including a monitor speaker, microphone, a push-to-talk switch and associated cicuitry, said associated circitry connecting said speaker, microphone and switch to said audio and push-to-talk buses in said housing.

5. A control center as claimed in claim 4 wherein each control module includes compressor amplifier means connected to couple audio between the control module and the audio bus.

6. A control center as claimed in claim 1 wherein the buses include a tone mute bus and a tone encoder bus and the center includes in addition a patch tone encoder module mounted in the housing, said tone encoder module including tone generating means coupled to said tone encoder bus for supplying a plurality of tones in sequence and further including tone mute generating means coupled to said tone mute bus for supplying a signal to mute at least one of the plurality of tones is selected ones of said plurality of control modules.

7. A control center as claimed in claim 1 wherein each control module includes an indicator mounted on the front panel and connected to the switch for indicating when the switch is operated and a patch is in process.

* * * * *